United States Patent
Jeon et al.

(10) Patent No.: US 11,729,992 B2
(45) Date of Patent: Aug. 15, 2023

(54) NONVOLATILE MEMORY DEVICE AND CROSS POINT ARRAY DEVICE INCLUDING THE SAME

(71) Applicant: KOREA ADVANCED INSTITUTE OF SCIENCE AND TECHNOLOGY, Daejeon (KR)

(72) Inventors: Sanghun Jeon, Daejeon (KR); Youngin Goh, Daejeon (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 159 days.

(21) Appl. No.: 17/321,814

(22) Filed: May 17, 2021

(65) Prior Publication Data
US 2022/0352187 A1 Nov. 3, 2022

(30) Foreign Application Priority Data
Apr. 29, 2021 (KR) .................. 10-2021-0055997

(51) Int. Cl.
*H01L 21/00* (2006.01)
*H10B 53/30* (2023.01)
*H01L 49/02* (2006.01)

(52) U.S. Cl.
CPC ............ *H10B 53/30* (2023.02); *H01L 28/60* (2013.01)

(58) Field of Classification Search
CPC ................................ H01L 53/30; H01L 28/60
See application file for complete search history.

(56) References Cited

U.S. PATENT DOCUMENTS

| 7,656,622 B2 | 2/2010 | Tera et al. |
| 8,030,160 B2 | 10/2011 | Orimoto et al. |
| 8,675,386 B2 | 3/2014 | Song |

(Continued)

FOREIGN PATENT DOCUMENTS

| KR | 10-2009-0133101 A | 12/2009 |
| KR | 10-2010-0009722 A | 1/2010 |

(Continued)

OTHER PUBLICATIONS

Youngin Goh et al., "Excellent Reliability and High-Speed Antiferroelectric HfZrO2 Tunnel Junction by a High-Pressure Annealing Process and Built-In Bias Engineering", ACS Applied Materials & Interfaces www.acsami.org Research Article, https://dx.doi.org/10.1021/acsami.0c15091 downloaded Dec. 13, 2020.

(Continued)

*Primary Examiner* — Richard A Booth
(74) *Attorney, Agent, or Firm* — Harness, Dickey & Pierce, P.L.C.

(57) ABSTRACT

Provided is a nonvolatile memory device including a lower electrode on a substrate, an upper electrode on the lower electrode, a tunnel barrier pattern between the lower electrode and the upper electrode, and a fixed charge pattern in contact with the lower electrode and spaced apart from the tunnel barrier pattern with the lower electrode therebetween. The tunnel barrier pattern includes an anti-ferroelectric material. The lower electrode includes a first material. The upper electrode includes a second material. The first material and the second material have different work functions.

18 Claims, 7 Drawing Sheets

(56) References Cited

U.S. PATENT DOCUMENTS

| | | | |
|---|---|---|---|
| 2005/0247970 A1* | 11/2005 | Jeon | H01L 21/28202 |
| | | | 257/314 |
| 2010/0213524 A1* | 8/2010 | Jeon | H01L 27/105 |
| | | | 257/306 |
| 2017/0256552 A1 | 9/2017 | Schroder et al. | |
| 2021/0202508 A1* | 7/2021 | Jeon | H10B 53/00 |

FOREIGN PATENT DOCUMENTS

| | | |
|---|---|---|
| KR | 10-2012-0007628 A | 1/2012 |
| KR | 10-2017-0102428 A | 9/2017 |

OTHER PUBLICATIONS

Milan Peši'c. et al., "Built-In Bias Generation in Anti-Ferroelectric Stacks: Methods and Device Applications", 10.1109/JEDS.2018.2825360, vol. 6, 2018.

\* cited by examiner

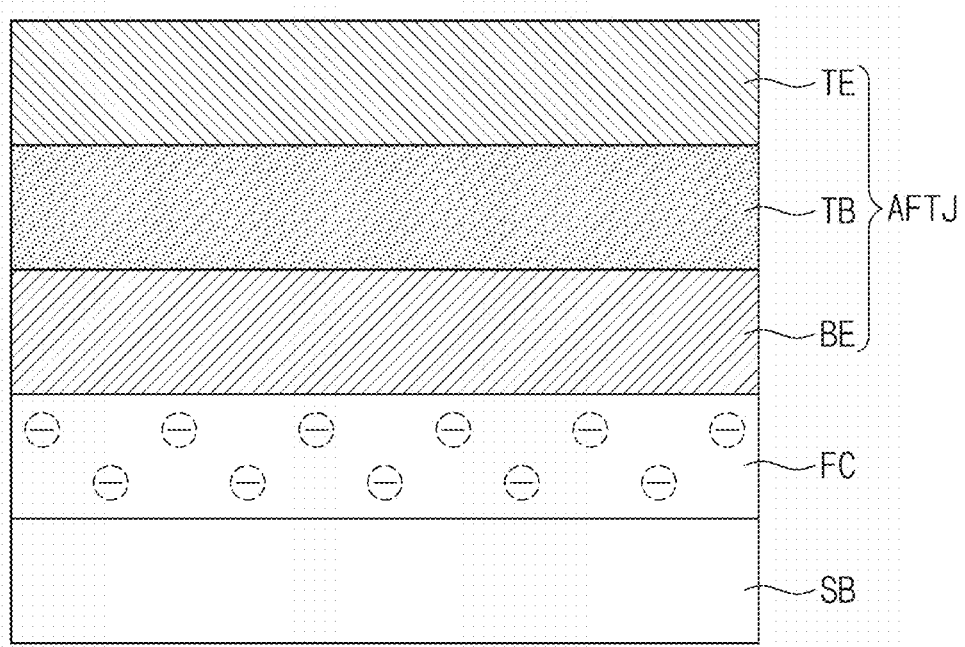

NONVOLATILE MEMORY DEVICE AND CROSS POINT ARRAY DEVICE INCLUDING THE SAME

CROSS-REFERENCE TO RELATED APPLICATIONS

This U.S. non-provisional patent application claims priority under 35 U.S.C. § 119 of Korean Patent Application No. 10-2021-0055997, filed on Apr. 29, 2021, the entire contents of which are hereby incorporated by reference.

BACKGROUND

The present disclosure herein relates to a nonvolatile memory device and a cross point array device including the same.

In general, ferroelectric materials refer to materials having spontaneous electrical polarization in a state where no external electric field is applied. To be specific, the ferroelectric materials may keep any one of two stable remanent polarization states. Such property may be used to store information of "0" and "1" in a nonvolatile manner. The remanent polarization is switchable when an external electric field is applied, and accordingly, research is being conducted to apply the ferroelectric materials to a nonvolatile memory device.

In contrast, anti-ferroelectric materials refer to materials that have no spontaneous electrical polarization in a state where no external electric field is applied, but exhibit the same characteristics as ferroelectric materials when an electric field is applied.

SUMMARY

The present disclosure provides a nonvolatile memory device using an anti-ferroelectric material.

An embodiment of the inventive concept provides a nonvolatile memory device including a lower electrode on a substrate, an upper electrode on the lower electrode, a tunnel barrier pattern between the lower electrode and the upper electrode, and a fixed charge pattern in contact with the lower electrode and spaced apart from the tunnel barrier pattern with the lower electrode therebetween, wherein the tunnel barrier pattern includes an anti-ferroelectric material, the lower electrode includes a first material, the upper electrode includes a second material, and the first material and the second material have different work functions.

In an embodiment of the inventive concept, a nonvolatile memory device includes an anti-ferroelectric tunnel junction pattern on a substrate, and an oxide layer between the substrate and the anti-ferroelectric tunnel junction pattern, wherein the anti-ferroelectric tunnel junction pattern includes a lower electrode, an upper electrode on the lower electrode, and a tunnel barrier pattern between the lower electrode and the upper electrode, the oxide layer is spaced apart from the tunnel barrier pattern with the lower electrode therebetween and is in contact with the lower electrode, the tunnel barrier pattern includes an anti-ferroelectric material, the anti-ferroelectric material contains $Hf_xZr_{1-x}O_2$ (x>0), in the tunnel barrier pattern, Zr is contained in a greater amount than Hf, and the oxide layer contains a fixed charge.

In an embodiment of the inventive concept, a cross point array device includes a first conductive line extending along a first direction, a second conductive line extending along a second direction crossing the first conductive line, and a pillar structure provided between the first conductive line and the second conductive line, wherein the pillar structure includes a fixed charge pattern, a lower electrode, an anti-ferroelectric pattern, and an upper electrode stacked, which are stacked in order, the fixed charge pattern is in contact with the lower electrode, and is spaced apart from the anti-ferroelectric pattern with the lower electrode therebetween, the lower electrode includes a first material, the upper electrode includes a second material, and the first material and the second material have different work functions.

BRIEF DESCRIPTION OF THE FIGURES

The accompanying drawings are included to provide a further understanding of the inventive concept, and are incorporated in and constitute a part of this specification. The drawings illustrate embodiments of the inventive concept and, together with the description, serve to explain principles of the inventive concept. In the drawings:

FIG. 1 is a conceptual view illustrating a cross-section of a nonvolatile memory device according to embodiments of the inventive concept;

DETAILED DESCRIPTION

Figure 2A:
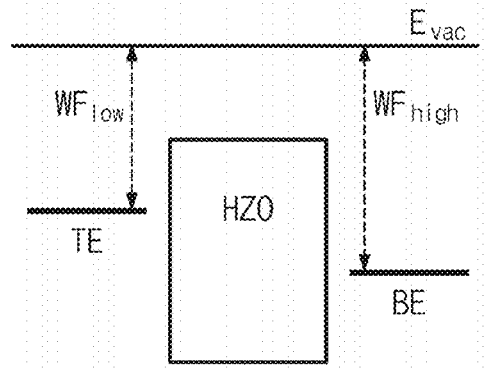
FIG. 2A illustrates band gap energy before formation of an anti-ferroelectric tunnel junction pattern of FIG. 1.

Hereinafter, embodiments of the inventive concept will be described in more detail with reference to the accompanying drawings in order to describe the inventive concept in more detail.

FIG. 1 is a conceptual view illustrating a cross-section of a nonvolatile memory device according to embodiments of the inventive concept.

Referring to FIG. 1, a nonvolatile memory device 100 according to the inventive concept may include a fixed charge pattern FC disposed on a substrate SB and an anti-ferroelectric tunnel junction pattern AFTJ.

The substrate SB may be a semiconductor substrate including silicon, silicon on an insulator (SOI), silicon germanium (SiGe), germanium (Ge), gallium arsenide (GaAs), etc. Although not shown, an interlayer insulating film, a contact, and a line may be interposed between the substrate SB and the fixed charge pattern FC.

According to some embodiments, a field effect transistor (not shown, e.g., AFE-RAM) may be additionally interposed between the substrate SB and the fixed charge pattern FC.

The fixed charge pattern FC may be provided between the substrate SB and the anti-ferroelectric tunnel junction pattern AFTJ. The fixed charge pattern FC will be described below.

The anti-ferroelectric tunnel junction pattern AFTJ may include a lower electrode BE, a tunnel barrier pattern TB, and an upper electrode TE, which are sequentially stacked.

The lower electrode BE may include a first material. The first material may include any one among a metal, a metal oxide, and a semiconductor. The metal may contain TiN, TaN, NbN, VN, ZrN, HfN, TiAlN, W, Cu, Pt, Mo, Ni, Al, etc. The metal oxide may contain $RuO_2$, $IrO_2$, ITO (Indium Tin Oxide), IGZO (Indium Gallium Zinc Oxide), IZO (Indium Zinc Oxide), AZO (Aluminum-doped Zinc Oxide), HIZO (Hafnium Indium Zinc Oxide), etc. The semiconductor may include n-type Si, p-type Si, Ge, SiGe, etc.

The tunnel barrier pattern TB may be provided on the lower electrode BE. The tunnel barrier pattern TB may be referred to as an anti-ferroelectric pattern TB. That is, the tunnel barrier pattern TB may include an anti-ferroelectric material. To be specific, the tunnel barrier pattern TB may include $Hf_xZr_{1-x}O_2$ (HZO) (x>0). In the tunnel barrier pattern TB, Zr may be contained in a greater amount than Hf. For example, the ratio of Hf to Zr in HfxZr1-xO2 (x>0) may be about 1:3. The tunnel barrier pattern TB may have a thickness of about 3 nm to about 10 nm. According to some embodiments, the tunnel barrier pattern TB may include $ZrO_2$.

The upper electrode TE may be provided on the tunnel barrier pattern TB. The upper electrode TE may be spaced apart from the lower electrode BE with the tunnel barrier pattern TB therebetween. The upper electrode TE may include a second material. Like the first material, the second material may include any one among a metal, a metal oxide, and a semiconductor. The metal may include TiN, W, Pt, Mo, Ni, Al, etc. The metal oxide may include $RuO_2$, $IrO_2$, ITO, IGZO, etc. The semiconductor may include n-type Si, p-type Si, Ge, SiGe, etc.

The first material may be different from the second material. According to the inventive concept, work functions of the first material and the second material may be different from each other. A difference in work function between the first material and the second material may be 0.5 eV or greater.

The work function is a value of energy required to remove an electron into vacuum from atoms of a material when the electron in the material is initially situated at the Fermi level, which indicates an intrinsic property of a material.

For example, the first material may be $RuO_2$ and the second material may be TiN. $RuO_2$ may have a work function of about 5.1 eV, and TiN may have a work function of about 4.5 eV.

According to some embodiments, an intermediate compound layer may be interposed between the lower electrode BE and the tunnel barrier pattern TB and/or between the tunnel barrier pattern TB and the upper electrode TE. The intermediate compound layer may be a layer formed by diffusion in the manufacturing process.

For example, when the lower electrode BE contains $RuO_2$, the tunnel barrier pattern TB contains $Hf_xZr_{1-x}O_2$ (x>0), and the upper electrode TE contains TiN, an intermediate compound layer including $TiO_2$ or $TiO_aN_b$ may be interposed between the upper electrode TE and the tunnel barrier pattern TB. The intermediate compound layer including $TiO_2$ or $TiO_aN_b$ may be a layer formed by diffusion of oxygen atoms from the tunnel barrier pattern TB and diffusion of titanium atoms and/or nitrogen atoms from the upper electrode TE.

Going back to describing the fixed charge pattern FC, the fixed charge pattern FC may be provided between the substrate SB and the lower electrode BE. The fixed charge pattern FC may contact the lower electrode BE. The fixed charge pattern FC may be spaced apart from the tunnel barrier pattern TB with the lower electrode BE therebetween.

Although not shown, according to some embodiments, the fixed charge pattern FC may be provided on the upper electrode TE. The fixed charge pattern FC may contact the upper electrode TE. The fixed charge pattern FC may be spaced apart from the tunnel barrier pattern TB with the upper electrode TE therebetween.

The fixed charge pattern FC may be an oxide layer containing fixed charges. In the present description, the fixed charges refer to, in a nonvolatile memory device, charges having no change in position thereof when a cell operating electric field is applied. The fixed charges may be positive or negative. In the fixed charges (positive charges or negative charges), most of the fixed charges may be disposed in an interface region adjacent to the lower electrode BE. The fixed charge pattern FC may include an oxide, and the oxide may include any one among $SiO_2$, $HfO_2$, $ZrO_2$, $TiO_2$, VO, $Nb_2O_5$, $Ta_2O_5$, $Al_2O_3$, $Y_2O_3$, and $Ln_2O_3$.

The fixed charge pattern FC containing positive charges may include at least one of a positively charged oxygen atom or oxygen vacancy. The oxygen vacancy has a charge of 2+, and the fixed charge pattern FC may thus have positive charges. The positively charged oxygen atom, for example, may be formed by doping the oxide with boron (B). For example, oxygen vacancy may be formed by using ozone ($O_3$) as a reaction gas in the process of forming the oxide, and insufficiently controlling the oxygen composition in a stoichiometric manner. The fixed charge pattern FC may include greater oxygen vacancy per unit area (or greater oxygen vacancy per unit volume) than the tunnel barrier pattern TB.

The fixed charge pattern FC containing negative charges may include at least one of a negatively charged oxygen atom or an interstitial oxygen atom. The negatively charged oxygen atom may be formed, for example, by doping the oxide with impurities such as phosphorus (P) or arsenic (As). For example, the interstitial oxygen atom may be formed by using ozone ($O_3$) as a reaction gas in the process of forming the oxide, and stoichiometrically controlling the oxygen composition in excess.

The fixed charge pattern FC may have a thickness of about 4.2 nm to about 8 nm. For example, when the fixed charge pattern FC has a thickness of 6 nm, the amount of charge may be $10^{11} \sim 10^{12}$ $cm^2$. The amount of charge may be determined by adjusting the thickness of the fixed charge pattern FC and the concentration of the reaction gas in the manufacturing process of the fixed charge pattern FC.

Figure 2B:
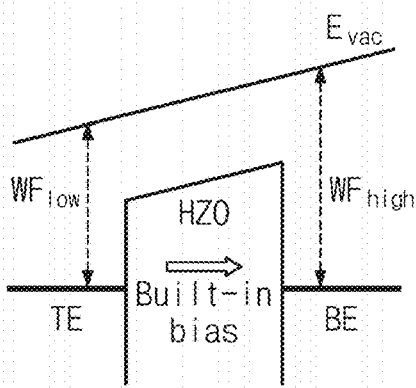
FIG. 2B illustrates band gap energy after formation of an anti-ferroelectric tunnel junction pattern of FIG. 1.
Figure 2C:
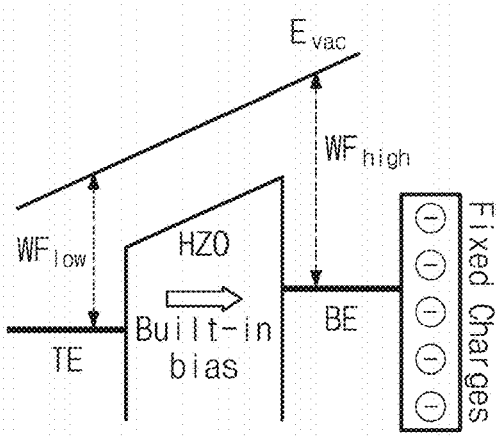
FIG. 2C illustrates band gap energy when a negative fixed charge pattern is attached to the anti-ferroelectric tunnel junction pattern of FIG. 1.

FIG. 2A illustrates band gap energy before formation of an anti-ferroelectric tunnel junction pattern. FIG. 2B illustrates band gap energy after formation of an anti-ferroelectric tunnel junction pattern. FIG. 2C illustrates band gap energy when a positive fixed charge pattern is attached to the anti-ferroelectric tunnel junction pattern of FIG. 1.

Referring to FIGS. 1 and 2A, the lower electrode BE may include a first material having a high work function $WF_{high}$, and the upper electrode TE may include a second material having a low work function $WF_{low}$. For example, the first material may be $RuO_2$ and the second material may be TiN.

Referring to FIGS. 1 and 2B, the anti-ferroelectric tunnel junction pattern AFTJ may be formed when the lower electrode BE and the upper electrode TE contact the tunnel barrier pattern TB containing HZO. The difference between the high work function $WF_{high}$ of the lower electrode BE and the low work function $WF_{low}$ of the upper electrode TE may cause an internal electric field (built-in bias, $V_{built-in}$) in the tunnel barrier pattern TB from the upper electrode TE to the lower electrode BE.

The internal electric field (built-in bias, $V_{built-in}$) may be expressed as Equation 1 below. q represents a unit charge, $WF_{TE}$ represents a work function of the upper electrode TE, and $WF_{BE}$ represents a work function of the lower electrode BE.

$$V_{built-in} = \frac{1}{q}(WF_{TE} - WF_{BE}) \quad \text{[Equation 1]}$$

Referring to FIGS. 1 and 2C, when the fixed charge pattern FC containing negative charges is attached to the lower electrode BE, an internal electric field (built-in bias) may be stronger in the tunnel barrier pattern TB.

The internal electric field ($V_{built-in}$) additionally applied by the fixed charge pattern FC may be expressed as Equation 2 below.

$$V_{built-in} = -\frac{Q_F}{C_{ox}} \quad \text{[Equation 2]}$$

$Q_F$ represents a fixed charge per unit area, and $C_{OX}$ represents a capacitance of the fixed charge pattern FC.

According to the inventive concept, the internal electric field changes voltage-polarization characteristics of the anti-ferroelectric pattern TB, thereby keeping the anti-ferroelectric pattern TB in a polarized state even when no external electric field is applied. Accordingly, a nonvolatile memory device including the anti-ferroelectric pattern TB may be obtained.

The following experimental example illustrates a process of manufacturing a nonvolatile memory device according to the inventive concept.

EXPERIMENTAL EXAMPLE

Using a thermal ALD method, a 16 nm-thick $HfO_2$ fixed charge layer was formed on a silicon oxide ($SiO_2$)/silicon (Si) substrate. Tetrakis (ethylmethylamido) hafnium (IV) was used as a Hf source, and ozone ($O_3$) was used as a reaction gas. The $HfO_2$ fixed charge layer was formed in an ozone concentration range of 130 sccm to 300 sccm, and the ozone concentration and the thickness of the fixed charge layer were adjusted to obtain negative fixed charges. Using thermal ALD, a 5 nm-thick $RuO_2$ lower electrode layer was formed on the $HfO_2$ fixed charge layer. At 225° C., a $RuO_2$ lower electrode layer was formed using a $Ru(EtCp)_2$ precursor and an $O_2$ reaction gas. Thereafter, a 6 mm-thick $H_2O$ tunnel barrier layer was formed. The $H_2O$ tunnel barrier layer was set to have the ratio of Hf to Zr to 1:3 to form an anti-ferroelectric material. Using DC sputtering, a TiN upper electrode layer having a thickness of 30 nm was formed on the $H_2O$ tunnel barrier pattern layer. Through a photolithography process and an etching process, an upper electrode layer, a tunnel barrier layer, a lower electrode layer, and a fixed charge layer were sequentially patterned to form an upper electrode, a tunnel barrier pattern, a lower electrode, and a fixed charge pattern. Thereafter, heat treatment was performed at 600° C. and high pressure in an $N_2$ atmosphere.

The following comparative example had a different electrode material from the experimental example, and a semiconductor device was manufactured without forming a fixed charge pattern.

COMPARATIVE EXAMPLE

Unlike the experimental example, a lower TiN electrode layer was formed on a silicon oxide ($SiO_2$)/silicon (Si) substrate without forming a $HfO_2$ fixed charge layer. An $H_2O$ tunnel barrier layer was deposited to be 10 mm-thick. An upper TiN electrode layer was formed on the $H_2O$ tunnel barrier layer. Other processes were performed substantially in the same manner as in the experimental example.

Figure 3A:
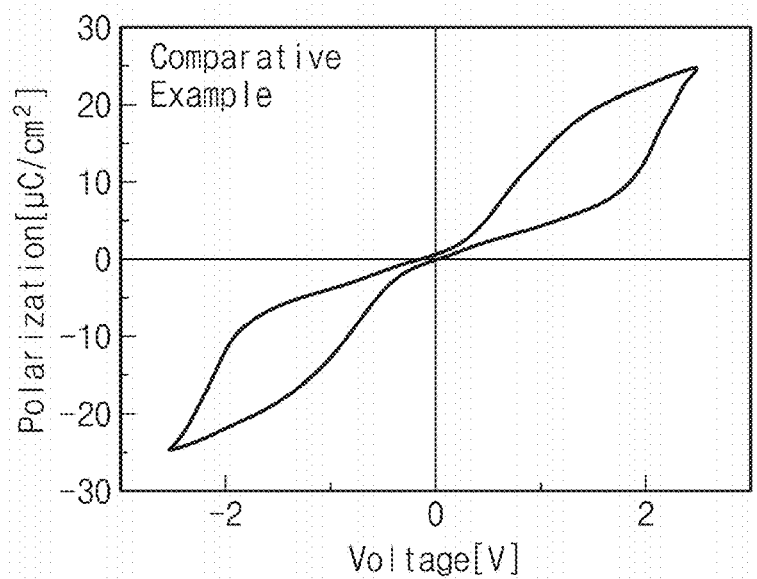
FIG. 3A illustrates a hysteresis loop according to a comparative example.
Figure 3B:
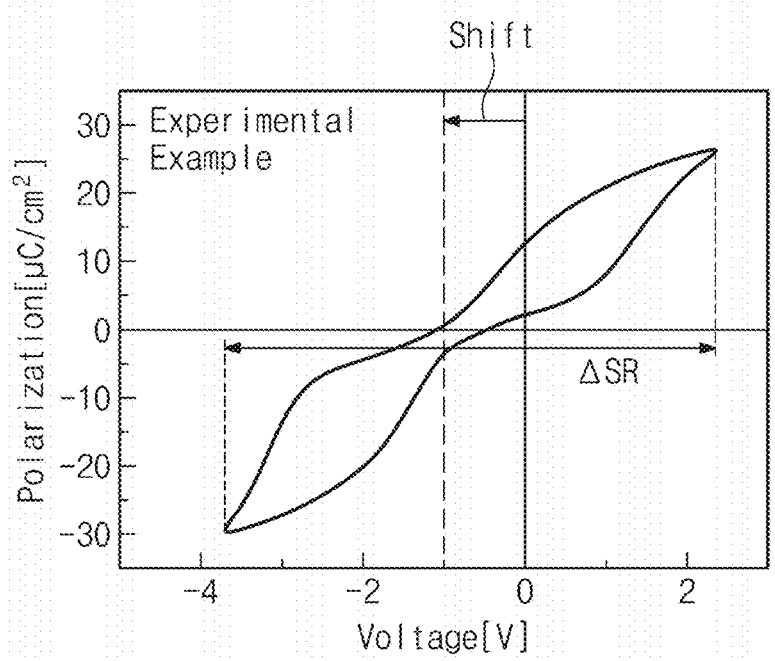
FIG. 3B illustrates a hysteresis loop according to an experimental example.

FIG. 3A illustrates a hysteresis loop according to the comparative example. FIG. 3B illustrates a hysteresis loop according to the experimental example.

Referring to FIG. 3A, in the comparative example, a state may be provided substantially near 0V, and remanent polarization may be close to 0. Referring to FIG. 3B, two different states (0 and 1) may be provided near 0V. In addition, even at 0V, a difference in remanent polarization is great, making it easy to read the two states. The experimental example may have a form in which a hysteresis loop is shifted to the left compared to the comparative example. The experimental example may have an operating voltage range (ΔSR) of −3.2 V to 1.8 V.

That is, when comparing the comparative example and the experimental example, even when an anti-ferroelectric material is used as a tunnel barrier pattern, it may be possible to obtain a nonvolatile memory device according to the provision of electrodes having different work functions and a fixed charge pattern.

It was observed that the nonvolatile memory device using an anti-ferroelectric material had higher switching speed and durability than the nonvolatile memory device using a ferroelectric material. In addition, according to the inventive concept, even when using an anti-ferroelectric, polarization is formed with no external voltage applied, and it may thus be useful as a nonvolatile memory device.

According to the inventive concept, the fixed charge pattern FC may not be provided between the lower electrode BE and the tunnel barrier pattern TB and between the upper electrode TE and the tunnel barrier pattern TB. Specifically, the fixed charge pattern FC may not contact the tunnel barrier pattern TB. When the fixed charge pattern FC was provided between the tunnel barrier pattern TB and the lower electrode BE, and was formed in contact with the tunnel barrier pattern TB, the hysteresis loop slightly shifted compared to the experimental example, and strengthening of the internal electric field according to the fixed charge pattern FC was hardly observed. In the heat treatment process described above in the experimental example, active diffusion between the fixed charge pattern FC and the tunnel barrier pattern TB, reduction in the internal electric field effect, or a change in anti-ferroelectric properties of the tunnel barrier pattern were observed.

Figure 4:
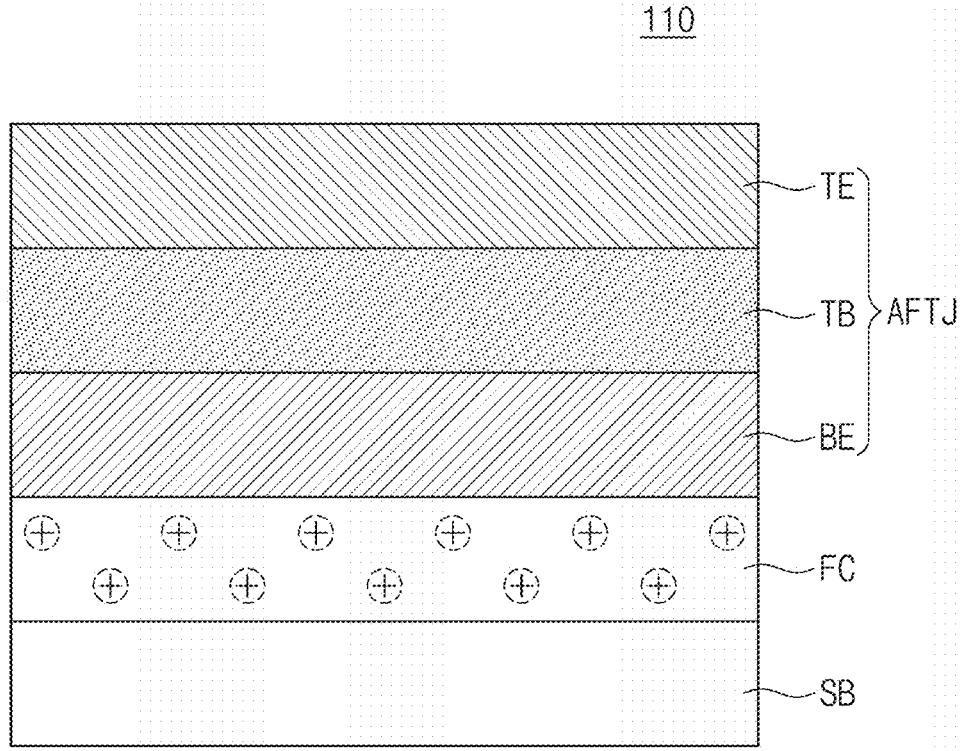
FIG. 4 is a cross-sectional view of a nonvolatile memory device according to some embodiments.
Figure 5A:
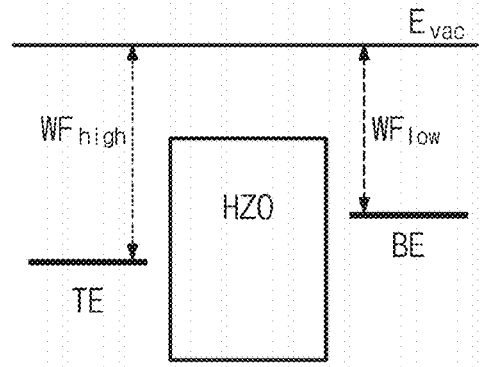
FIG. 5A illustrates band gap energy before formation of an anti-ferroelectric tunnel junction pattern of FIG. 4.
Figure 5B:
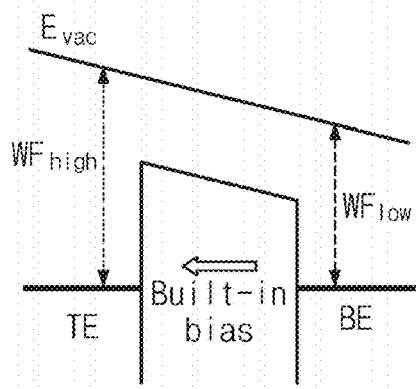
FIG. 5B illustrates band gap energy after formation of an anti-ferroelectric tunnel junction pattern of FIG. 4.
Figure 5C:
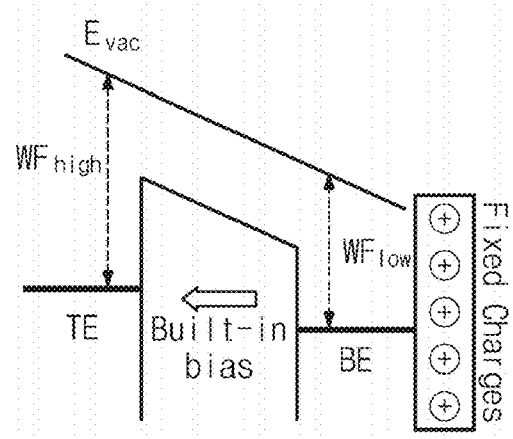
FIG. 5C illustrates band gap energy when a positive fixed charge pattern is attached to the anti-ferroelectric tunnel junction pattern of FIG. 4.

FIG. 4 is a cross-sectional view of a nonvolatile memory device according to some embodiments. FIG. 5A illustrates band gap energy before formation of an anti-ferroelectric tunnel junction pattern of FIG. 4. FIG. 5B illustrates band gap energy after formation of an anti-ferroelectric tunnel junction pattern of FIG. 4. FIG. 5C illustrates band gap energy when a negative fixed charge pattern is attached to the anti-ferroelectric tunnel junction pattern of FIG. 4. Descriptions overlapping those described in FIGS. 1 and 2A to 2C will be omitted.

Referring to FIGS. 4 and 5A, the lower electrode BE may include a first material having a low work function $WF_{low}$, and the upper electrode TE may include a second material having a high work function $WF_{high}$. For example, the first material may be TiN, and the second material may be $RuO_2$.

Referring to FIGS. 4 and 5B, the anti-ferroelectric tunnel junction pattern AFTJ may be formed when the lower electrode BE and the upper electrode TE contact the tunnel barrier pattern TB containing HZO. The difference between the low work function $WF_{low}$ of the lower electrode BE and the high work function $WF_{high}$ of the upper electrode TE may cause an internal electric field (built-in bias, $V_{built-in}$) in the tunnel barrier pattern TB from the lower electrode BE to the upper electrode TE.

Referring to FIGS. 4 and 5C, when the fixed charge pattern FC containing positive charges is attached to the lower electrode BE, an internal electric field (built-in bias) may be stronger in the tunnel barrier pattern TB.

That is, according to the inventive concept, the combination of the upper electrode TE and the lower electrode BE may vary depending on charge characteristics of the fixed charge pattern FC. As shown in FIG. 1, when the fixed charge pattern FC contains negative charges, forming the lower electrode BE to have a greater work function than the upper electrode TE may increase the strength of the internal electric field. In addition, when the fixed charge pattern FC contains positive charges, forming the lower electrode BE to have a less work function than the upper electrode TE may increase the strength of the internal electric field.

Figure 6:
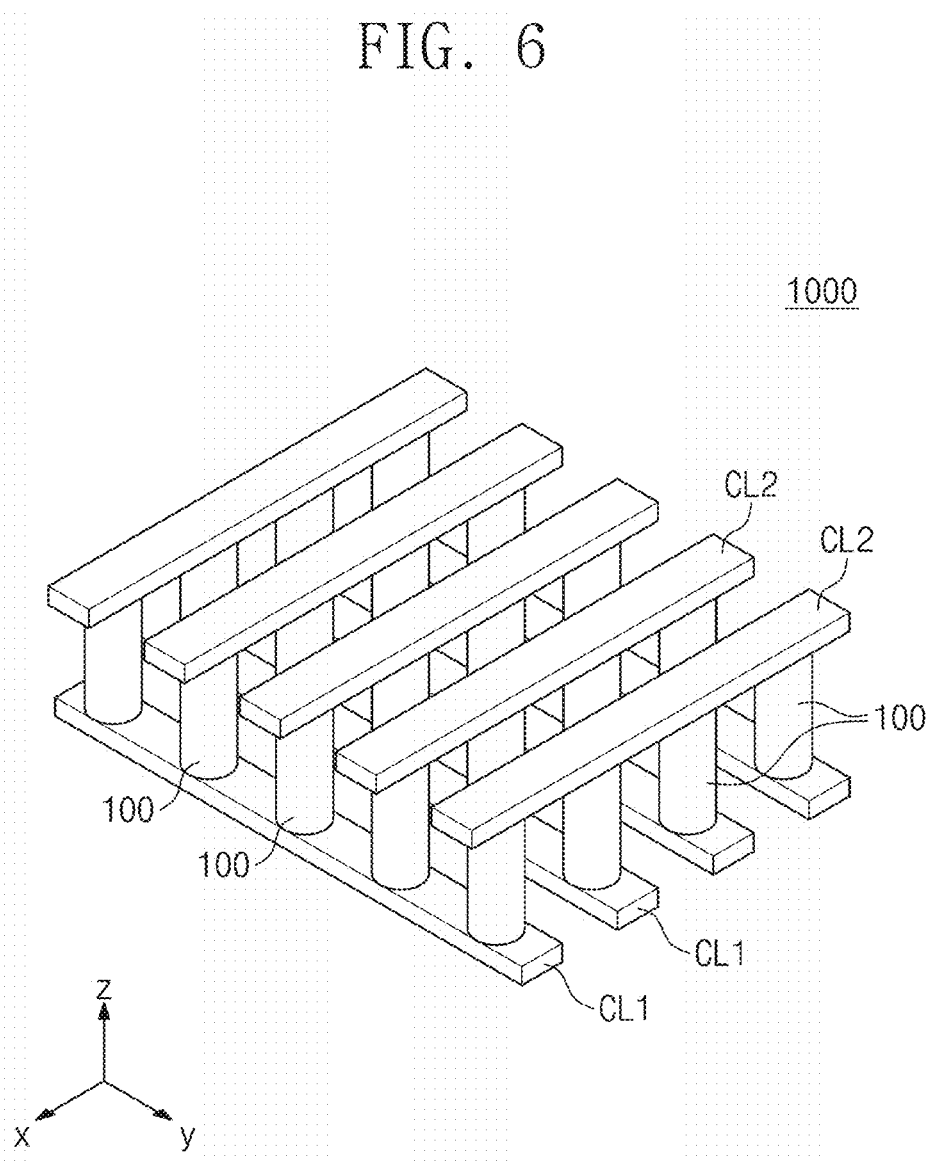
FIG. 6 is a perspective view illustrating a cross point array device according to an embodiment of the inventive concept.
Figure 7:
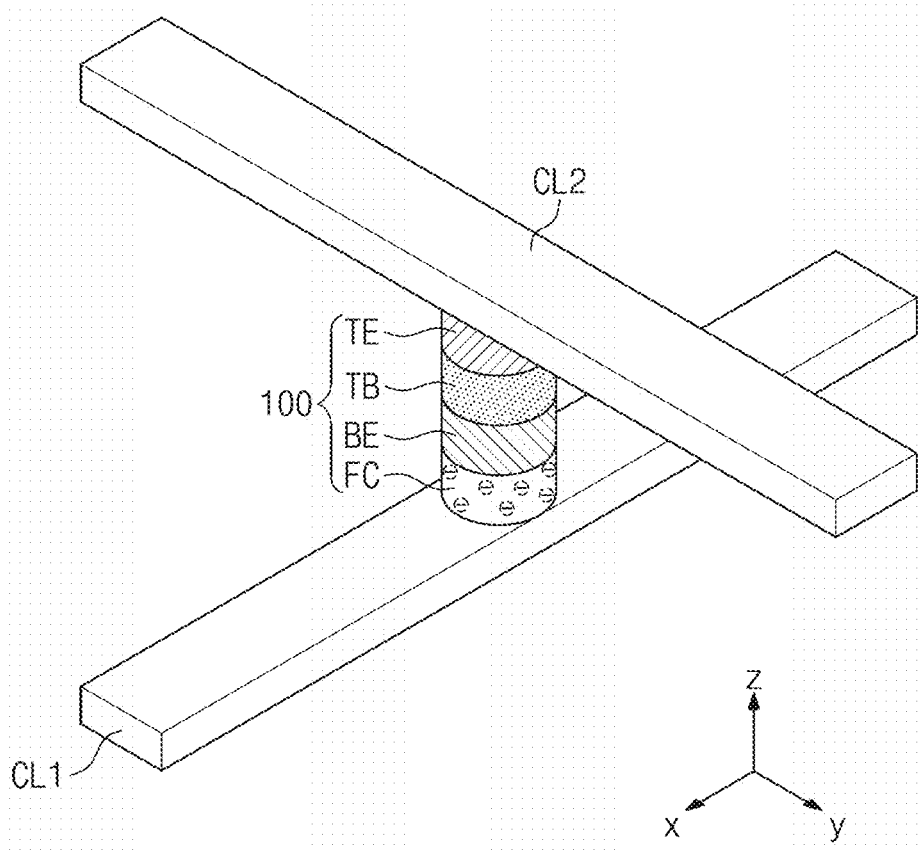
FIG. 7 is a view partially enlarging the cross-point array device of FIG. 6.

FIG. 6 is a perspective view illustrating a cross point array device according to an embodiment of the inventive concept. FIG. 7 is a view partially enlarging the cross-point array device of FIG. 6. Except for those described below, descriptions overlapping those described in FIG. 1 will be omitted.

Referring to FIG. 6, a cross-point array device 1000 includes a first conductive line CL1 arranged in a x-direction, a second conductive line CL2 arranged in a y-direction, and pillar structures 100 disposed along a z-direction in a region where the first and second conductive lines CL1 and CL2 cross. Each of the pillar structures 100 may correspond to the nonvolatile memory device 100 of FIG. 1.

Referring to FIG. 7, the pillar structure 100 may include a lower electrode BE, a tunnel barrier pattern TB, an upper electrode TE, and a fixed charge pattern FC. The fixed charge pattern FC may contact the first conductive line CL1. According to some embodiments, a contact may be interposed between the fixed charge pattern FC and the first conductive line CL1. The first conductive line CL1 may contain at least one among doped semiconductor materials (e.g., doped silicon), metals (e.g., tungsten, titanium, and/or tantalum), conductive metal nitrides (e.g., titanium nitride, tantalum nitride, and/or tungsten nitride), and metal-semiconductor compounds (e.g., metal silicide).

According to some embodiments, each of the first conductive lines CL1 may be additionally connected to field effect transistors. Each of the first conductive lines CL1 may be electrically connected to one terminal of a corresponding field effect transistor (e.g., AFE-RAM).

Each of the second conductive lines CL2 may be connected to the upper electrode TE. Each of the second conductive lines CL2 may include at least one of a metal (e.g., titanium, tantalum, copper, aluminum, tungsten, etc.) or a conductive metal nitride (e.g., titanium nitride, tantalum nitride, etc.). According to some embodiments, the second conductive line CL2 may serve as a bit line.

According to the inventive concept, an anti-ferroelectric tunnel junction device including upper and lower electrodes having different anti-ferroelectric materials and work functions may be prepared. In particular, using a fixed charge pattern in contact with one electrode and spaced apart from a tunnel barrier pattern, the anti-ferroelectric tunnel junction device may have an increased strength of an internal electric field between the upper electrode and the lower electrode. Accordingly, a nonvolatile semiconductor memory device having improved switching speed and durability may be obtained.

The above description on embodiments of the technical idea of the inventive concept provides examples for describing the technical idea of the inventive concept. Thus, the technical idea of the inventive concept is not limited to the above-described embodiments, and it would be clarified that various modifications and changes, for example, combinations of the above embodiments, could be made by those skilled in the art within the technical spirit of the inventive concept.

What is claimed is:
1. A nonvolatile memory device comprising:
a lower electrode on a substrate;
an upper electrode on the lower electrode;
a tunnel barrier pattern between the lower electrode and the upper electrode; and
a fixed charge pattern in contact with the lower electrode and spaced apart from the tunnel barrier pattern with the lower electrode therebetween,
wherein the tunnel barrier pattern includes an anti-ferroelectric material,
the lower electrode includes a first material,
the upper electrode includes a second material, and
the first material and the second material have different work functions.
2. The nonvolatile memory device of claim 1, wherein a difference in work function between the first material and the second material is greater than 0.5 eV.
3. The nonvolatile memory device of claim 1, wherein the fixed charge pattern contains any one among $SiO_2$, $HfO_2$, $ZrO_2$, $TiO_2$, VO, $Nb_2O_5$, $Ta_2O_5$, $Al_2O_3$, $Y_2O_3$, and $Ln_2O_3$.
4. The nonvolatile memory device of claim 1, wherein:
the first material has a greater work function than the second material; and
the fixed charge pattern has a negative charge.
5. The nonvolatile memory device of claim 1, wherein:
the first material has a less work function than the second material; and
the fixed charge pattern has a positive charge.
6. The nonvolatile memory device of claim 1, wherein the first material and the second material comprise any one among a metal, a metal oxide, and a semiconductor material,
the metal containing any one among TiN, TaN, NbN, VN, ZrN, HfN, TiAlN, W, Cu, Pt, Mo, Ni, and Al,
the metal oxide containing any one among $RuO_2$, $IrO_2$, ITO (Indium Tin Oxide), IGZO (Indium Gallium Zinc Oxide), IZO (Indium Zinc Oxide), AZO (Aluminum-doped Zinc Oxide), and HIZO (Hafnium Indium Zinc Oxide), and
the semiconductor material containing any one among n-type Si, p-type Si, Ge, and SiGe.

7. The nonvolatile memory device of claim 1, wherein the anti-ferroelectric material contains $Hf_xZr_{1-x}O_2$ (x>0) or $ZrO_2$.

8. The nonvolatile memory device of claim 1, wherein:
the anti-ferroelectric material contains $Hf_xZr_{1-x}O_2$ (x>0); and
in the tunnel barrier pattern, Zr is contained in a greater amount than Hf.

9. The nonvolatile memory device of claim 1, wherein the tunnel barrier pattern has a thickness of about 1 nm to about 10 nm.

10. The nonvolatile memory device of claim 1, wherein the fixed charge pattern has a thickness of about 4.2 nm to about 8 nm.

11. A nonvolatile memory device comprising:
an anti-ferroelectric tunnel junction pattern on a substrate; and
an oxide layer between the substrate and the anti-ferroelectric tunnel junction pattern,
wherein the anti-ferroelectric tunnel junction pattern includes:
a lower electrode;
an upper electrode on the lower electrode; and
a tunnel barrier pattern between the lower electrode and the upper electrode,
the oxide layer is spaced apart from the tunnel barrier pattern with the lower electrode therebetween, and is in contact with the lower electrode,
the tunnel barrier pattern includes an anti-ferroelectric material,
the anti-ferroelectric material contains $Hf_xZr_{1-x}O_2$ (x>0),
in the tunnel barrier pattern, Zr is contained in a greater amount than Hf, and
the oxide layer contains a fixed charge.

12. The nonvolatile memory device of claim 11, wherein the upper electrode and the lower electrode comprise materials having different work functions.

13. The nonvolatile memory device of claim 11, wherein:
the lower electrode contains $RuO_2$;
the upper electrode contains TiN; and
the oxide layer contains $HfO_2$.

14. The nonvolatile memory device of claim 11, wherein the oxide layer has a greater oxygen vacancy concentration than the tunnel barrier pattern.

15. The nonvolatile memory device of claim 11, further comprising a transistor provided on the substrate,
wherein one terminal of the transistor is electrically connected to the anti-ferroelectric tunnel junction pattern.

16. A cross point array device comprising:
a first conductive line extending along a first direction;
a second conductive line extending along a second direction crossing the first conductive line; and
a pillar structure provided between the first conductive line and the second conductive line,
wherein the pillar structure includes a fixed charge pattern, a lower electrode, an anti-ferroelectric pattern, and an upper electrode, which are stacked in order,
the fixed charge pattern is in contact with the lower electrode, and is spaced apart from the anti-ferroelectric pattern with the lower electrode therebetween,
the lower electrode includes a first material,
the upper electrode includes a second material, and
the first material and the second material have different work functions.

17. The cross point array device of claim 16, wherein:
the first material has a greater work function than the second material; and
the fixed charge pattern has a negative charge.

18. The cross point array device of claim 16, wherein:
the first material has a less work function than the second material; and
the fixed charge pattern has a positive charge.

* * * * *